(12) United States Patent
Tajima (10) Patent No.: US 6,522,675 B1
(45) Date of Patent: Feb. 18, 2003

(54) WAVELENGTH CONTROL CIRCUIT AND WAVELENGTH CONTROL METHOD OF LIGHT EMITTING DEVICE

(75) Inventor: Tsutomu Tajima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/448,887

(22) Filed: Nov. 29, 1999

(30) Foreign Application Priority Data

Nov. 27, 1998 (JP) .......................................... 10/336777

(51) Int. Cl.[7] ................................................. H01S 3/13
(52) U.S. Cl. .............................. 372/32; 372/29; 372/31
(58) Field of Search ............................... 372/29, 31, 32

(56) References Cited

U.S. PATENT DOCUMENTS

| | | | | |
|---|---|---|---|---|
| 5,019,769 A | * | 5/1991 | Levinson | 372/31 |
| 5,943,352 A | * | 8/1999 | Fee | 372/32 |
| 6,064,681 A | * | 5/2000 | Ackerman | 372/32 |
| 6,243,403 B1 | * | 6/2001 | Broutin et al. | 372/32 |
| 6,292,498 B1 | * | 9/2001 | Pfaff | 372/32 |

FOREIGN PATENT DOCUMENTS

| | | |
|---|---|---|
| JP | 2284486 | 11/1990 |
| JP | 5235460 | 9/1993 |
| JP | 6310796 | 11/1994 |
| JP | 774423 | 3/1995 |
| JP | 7249817 | 9/1995 |
| JP | 8-18145 | 1/1996 |

* cited by examiner

*Primary Examiner*—Paul Ip
*Assistant Examiner*—Cornelius H Jackson
(74) *Attorney, Agent, or Firm*—Young & Thompson (57) ABSTRACT

A wavelength control circuit includes a temperature control loop monitoring the ambient temperature of an LD device and driving an electronic heating and cooling device so that the temperature is constant on the basis of a difference signal between a signal value corresponding to the temperature and a reference signal. In a wavelength control loop, the wavelength of a light signal from the light emitting device is monitored by a wavelength monitor and the electronic heating and cooling device is controlled so that the wavelength is uniform. At power on, the temperature is controlled by the temperature control loop to control LD device wavelength. After the temperature control loop is stabilized, a control is performed with both the temperature control loop and the wavelength monitor.

20 Claims, 6 Drawing Sheets

WAVELENGTH CONTROL CIRCUIT AND WAVELENGTH CONTROL METHOD OF LIGHT EMITTING DEVICE

BACKGROUND OF THE INVENTION

1. Field of the Invention

The present invention relates to a wavelength control circuit and a wavelength control method of a light emitting device such as a semiconductor laser diode. More particularly, the invention relates to a wavelength control circuit and wavelength control method adapted to an optical transmission circuit of a wavelength multiplexing optical transfer apparatus.

2. Description of Related Art

It is known that the oscillation wavelength of a light emitting device such as a semiconductor laser diode changes according to the ambient temperature. As the ambient temperature increases, generally, the oscillation wavelength of a semiconductor laser diode shifts to the long wavelength side. On the contrary, as the ambient temperature decreases, the oscillation wavelength shifts to the short wavelength side.

In a wavelength control circuit of a conventional semiconductor laser diode, a semiconductor laser diode device (hereinbelow, called an "LD device") is disposed on an electronic heating and cooling device such as a Peltier cooler, a temperature sensing device is disposed near the LD device, and a uniform temperature is maintained while monitoring the temperature, thereby controlling the wavelength to be constant.

In an optical transfer system, however, an increase in transfer capacity has come to be demanded. In order to respond to the demand, a wavelength multiplexing optical transfer system for optically transferring a plurality of signal light having different wavelengths which are multiplexed is used.

In the wavelength multiplexing optical transfer system, in order to respond to a further increase in transfer capacity, the density of the signal light wavelengths further becomes higher. In a conventional wavelength control circuit which performs only a temperature control, a change in wavelength due to deterioration of a device cannot be monitored and controlled. The wavelength of the signal light from the LD device is therefore monitored and fed back for the temperature of the LD device, thereby controlling the wavelength. The structure disclosed in, for example, Japanese Unexamined Patent Application No. 7-249817 is known as a technique of monitoring the wavelength and driving an electronic heating and cooling device.

When a trouble such as a failure occurs for some reason in a wavelength monitor, however, the wavelength control circuit disclosed in the literature cannot control the wavelength of the signal light to a predetermined wavelength.

When the wavelength monitor is detached for maintenance of the wavelength monitor itself and is returned to an original temperature control loop, if the characteristics of an LD device are deteriorated at that time point, there is a problem such that a control is executed with an erroneous wavelength of signal light which is deviated from a desired wavelength.

SUMMARY OF THE INVENTION

It is an object of the invention to provide a wavelength control circuit and a wavelength control method of a semiconductor laser diode capable of normally controlling the wavelength not only in the case where the wavelength of an LD device changes but also at the time of maintenance of a wavelength monitor itself.

A wavelength control circuit of the invention comprises: a light emitting device for emitting signal light; a temperature sensing circuit for sensing a temperature around the light emitting device and outputting a temperature signal according to the temperature; and a wavelength deviation detecting circuit for detecting an oscillation wavelength of the signal light and outputting a second difference signal according to a wavelength deviation from a predetermined wavelength. The wavelength control circuit further comprises: an adding circuit for adding the first reference value with the second difference signal and outputting a signal obtained by the addition; a switching circuit for selectively outputting either the first reference value or the signal obtained by the addition; and a first difference signal generating circuit for comparing the first reference value or the signal obtained by the addition outputted from the switching circuit with the temperature signal and outputting a first difference signal. By a temperature control circuit, the temperature of the light emitting device is controlled by controlling a heating and cooling device on the basis of the first difference signal.

The switching circuit selects the first reference value after the start of light emission of the light emitting device and, after that, switches to select and output the signal obtained by the addition. The switching circuit selects the first reference value after the start of light emission of the light emitting device and, when a deviation of the first difference signal becomes smaller than a predetermined value, the switching circuit switches to select and output the signal obtained by the addition. Alternately, the switching circuit may select the first reference value for a predetermined time after the start of light emission of the light emitting device and switch to select and output the signal obtained by the addition after elapse of a predetermined time.

The wavelength control circuit of the invention further comprises a sample and hold circuit for sampling and holding the signal obtained by the addition and outputting the sampled signal, and the switching circuit selectively outputs the first reference value or the sampled signal. The sample and hold circuit comprises: an A/D converting circuit for converting the signal obtained by the addition into a digital signal; and a writable non-volatile memory for storing and holding the digital signal outputted from the A/D converting circuit.

On the other hand, the wavelength deviation detecting circuit includes: a wavelength monitor for outputting a wavelength signal according to the wavelength of the signal light; and a second difference signal generating circuit for comparing the wavelength signal with a second reference voltage and outputting a second difference signal. The wavelength deviation detecting circuit further comprises an optical branching device for branching a part of signal light emitted from the light emitting device and outputting the branched signal light to the wavelength monitor. Alternately, the wavelength deviation detecting circuit may output signal light emitted from the rear side of the light emitting device to the wavelength monitor.

A wavelength control circuit of the invention comprises: a light emitting device for emitting signal light; a temperature sensing circuit for sensing a temperature around the light emitting device and outputting a temperature signal according to the temperature; a wavelength deviation detecting circuit for detecting an oscillation wavelength of the signal light and outputting a second difference signal according to a wavelength deviation from a predetermined wavelength; an adding circuit for adding the second difference signal with the temperature signal and outputting a signal obtained by the addition; and a first difference signal generating circuit for comparing the first reference value with the addition signal and outputting a first difference signal. By a temperature control circuit, the temperature of the light emitting device is controlled by controlling a heating and cooling device on the basis of the first difference signal. In the construction of the invention as well, a sample and hold circuit for sampling and holding the signal obtained by the addition and outputting the sampled signal is provided and the switching circuit can selectively output the first reference value or the sampled signal.

The wavelength control circuit of the invention comprises a temperature control loop and a loop using a wavelength monitor. The temperature control loop monitors the ambient temperature of an LD device and drives an electronic heating and cooling device so that the temperature is constant on the basis of a difference signal between a signal value corresponding to the temperature and a reference signal. In the wavelength control loop, the wavelength of a light signal from the light emitting device is monitored by the wavelength monitor and the electronic heating and cooling device is controlled so that the wavelength is uniform. In the construction, at power on, the temperature is controlled by the temperature control loop, thereby controlling the wavelength of the LD device. On the other hand, after the temperature control loop is stabilized, a control is performed by using not only the temperature control loop but also the loop using the wavelength monitor. In the invention, a wavelength deviation detecting circuit for detecting a deviation in the signal light wavelength detected by the wavelength monitor as a difference signal is provided. It is also possible to perform a wavelength control by the temperature control loop by using a value obtained by adding the difference signal voltage and the reference voltage as a new reference voltage.

In the invention, it is also possible to provide a sample and hold circuit for sampling and holding a new reference voltage and supply a reference voltage held by the sample and hold circuit as a reference voltage of the temperature control loop. With the construction as well, the wavelength monitor can be maintained.

BRIEF DESCRIPTION OF THE DRAWINGS

The above and other objects, features and advantages of the present invention will become more apparent from the following detailed description when taken in conjunction with the accompanying drawings wherein.

DETAILED DESCRIPTION OF THE PREFERRED EMBODIMENTS

Before describing a wavelength control circuit of a light emitting device of the invention, a conventional wavelength control circuit will be described first in order to make the present invention understood easily.

Figure 1:
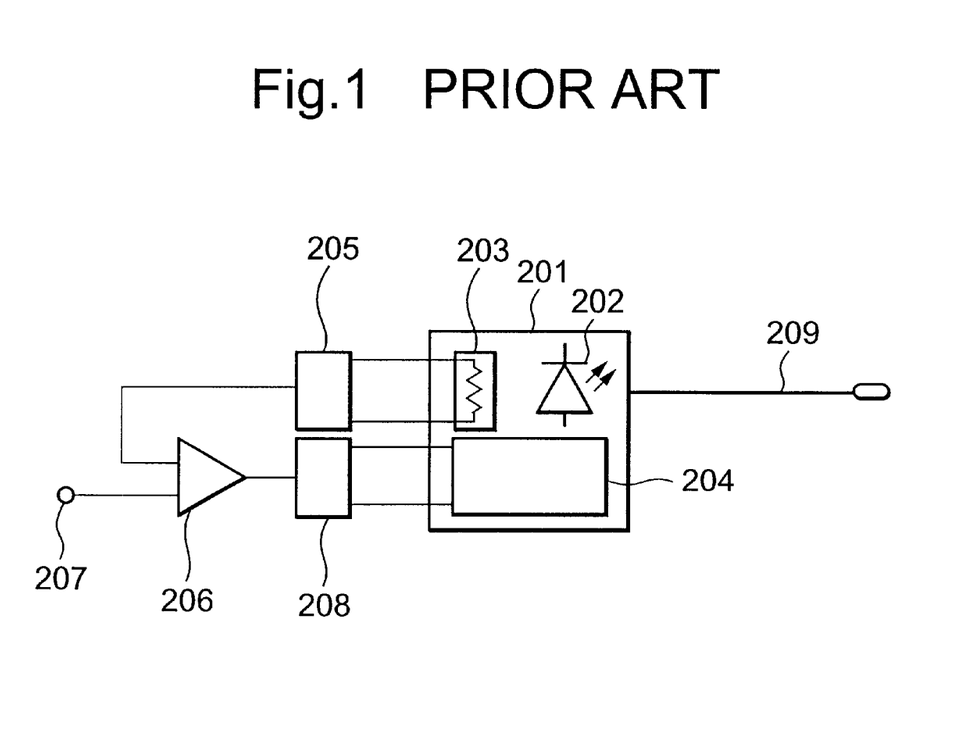
FIG. 1 is a diagram showing an example of the construction of a conventional wavelength control circuit of a light emitting device.

FIG. 1 is a diagram showing an example of the construction of a wavelength control circuit of a conventional LD device. A semiconductor laser diode as a representative light emitting device will be described hereinbelow as an example.

As shown in FIG. 1, a resistance value of a thermal resistor 203 such as a thermistor mounted in a semiconductor laser diode module (hereinbelow, referred to as "LD module") 201 is converted to a voltage by a resistor value—voltage converting circuit 205. The converted voltage and a reference voltage supplied from a reference voltage terminal 207 are supplied to an input terminal of a differential amplifier 206 acting as a negative feedback circuit. An output (difference voltage) of the differential amplifier 206 is supplied to a driving circuit 208 of an electronic heating and cooling device 204. The driving circuit 208 drives the electronic heating and cooling device 204 realized by a Peltier device on the basis of the difference voltage, thereby controlling the difference between a voltage value of the resistance value—voltage converting circuit 205 and the reference voltage to be reduced.

Figure 2:
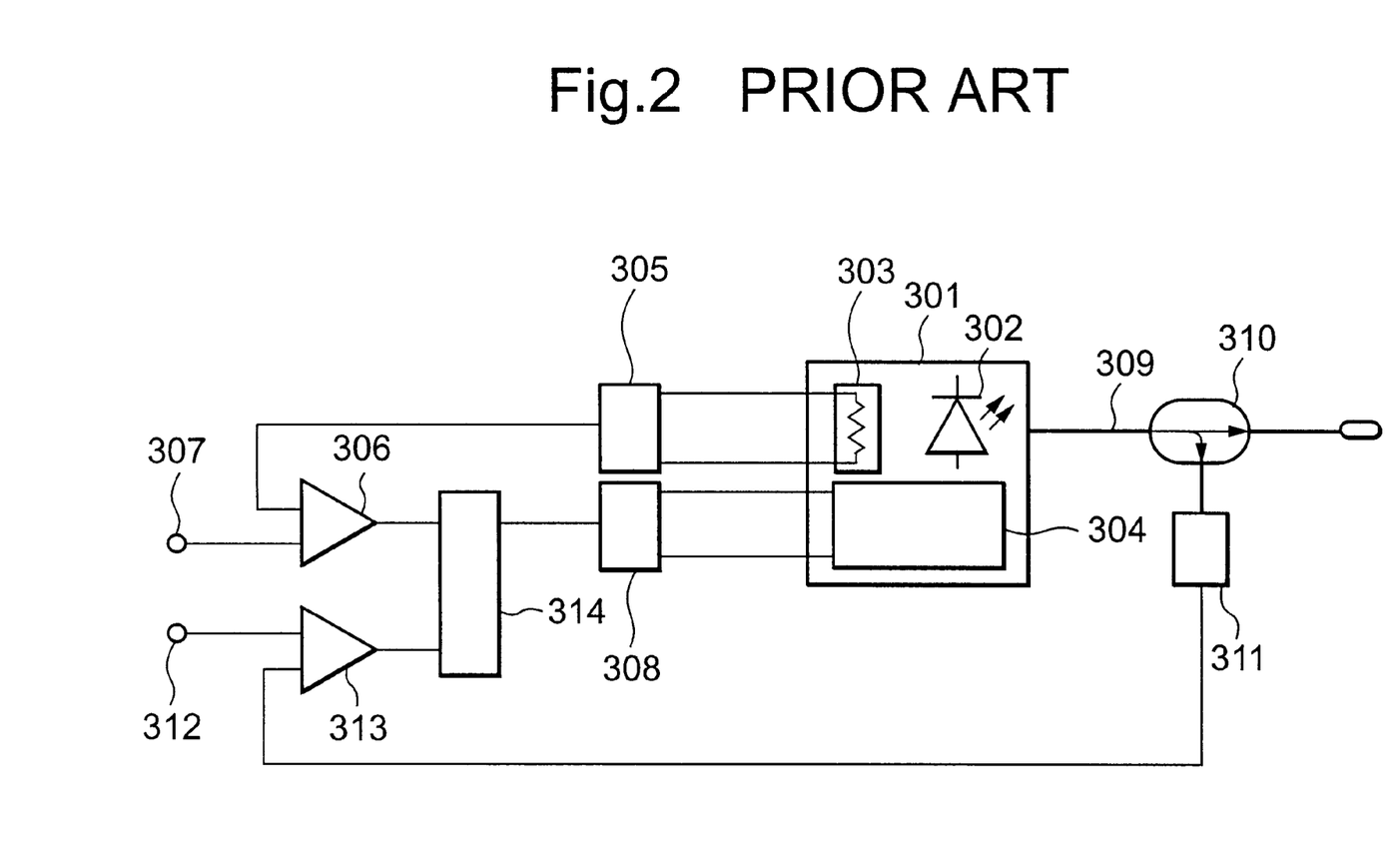
FIG. 2 is a diagram showing another example of the construction of the conventional wavelength control circuit of the light emitting device.

The thermal resistor 203, resistance value—voltage converting circuit 205, differential amplifier 206, driving circuit 208 of the electronic heating and cooling device, and electronic heating and cooling device 204 construct a temperature control loop for executing a feedback control so as to maintain the temperature of the LD device 102 to be constant. When the LD device 102 is maintained at a constant temperature, the wavelength of the LD device is controlled to be constant. In association with the increase in density of the signal light wavelengths of a wavelength multiplexing optical transfer apparatus in recent years, a wavelength control circuit as shown in FIG. 2 is also used. In addition to the construction of FIG. 1, a wavelength control circuit shown in FIG. 2 further comprises an optical branching device 310, a wavelength monitor 311, a second reference voltage terminal 312, a second differential amplifying circuit 313, and a switching circuit 314.

The optical branching device 310 branches a part of a light signal from an LD device 302. The wavelength monitor 311 monitors the wavelength of the signal branched by the optical branching device 310 and outputs a voltage corresponding to the wavelength. The second differential amplifying circuit 313 receives a voltage signal from the wavelength monitor 311 and a second reference voltage. A first differential amplifying circuit 306 receives a voltage of a resistance value—voltage converting circuit 305 and a first reference voltage supplied from the first reference voltage terminal 307. The switching circuit 314 receives outputs of the first and second differential amplifying circuits 306 and 313 and outputs one of them.

At power-on, the above-mentioned conventional wavelength control circuit controls the temperature of the LD device 302 within a predetermined temperature range by a temperature control loop comprised of a thermal resistor 303, the resistance value—voltage converting circuit 305, the first differential amplifying circuit 306 to which the first reference voltage is inputted and which acts as a negative feedback circuit, a driving circuit 308 of an electronic heating and cooling device 304, and the electronic heating and cooling device 304. After that, the switching circuit 314 switches a signal supplied to the electronic heating and cooling device driving circuit 308 from the output of the first differential amplifying circuit 306 to the output of the second differential amplifying circuit 313, so that the operation is changed from the temperature control loop to the wavelength control loop using the wavelength monitor 311, namely, the control loop comprising the wavelength monitor 311, differential amplifying circuit 313 to which the second reference voltage is applied and acts as an error signal amplifying circuit, electronic heating and cooling device driving circuit 308, and electronic heating and cooling device 304.

When the LD device deteriorates with time, however, it has generally a characteristic that the wavelength changes. When a trouble such as a failure occurs for some reason in the wavelength monitor, therefore, the conventional wavelength control circuit cannot control the signal light wavelength to a predetermined wavelength. In the case where the wavelength monitor is detached and is returned to the original temperature control loop for the maintenance of the wavelength monitor itself, when the characteristics of the LD device have deteriorated by that time point, there is also a problem such that a control is performed at an erroneous signal light wavelength deviated from a desired wavelength.

The wavelength control circuit of the semiconductor laser diode of the invention will be described in detail hereinbelow with reference to the drawings.

Figure 3:
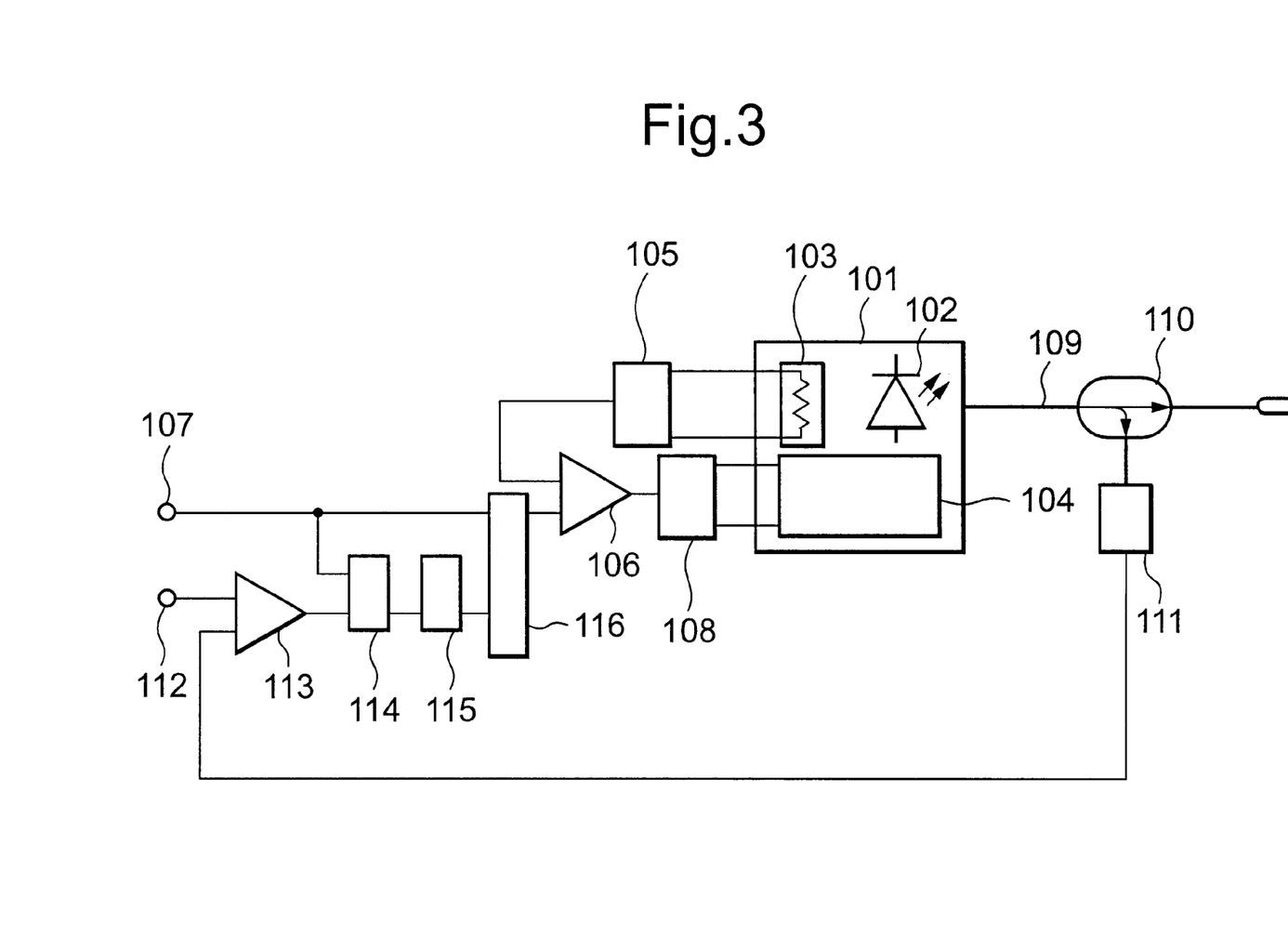
FIG. 3 is a diagram showing the construction of a first embodiment of a wavelength control circuit of a light emitting device of the invention.

FIG. 3 is a diagram showing the construction of a first embodiment of the wavelength control circuit of the semiconductor laser diode of the invention. The wavelength control circuit of the invention uses both of the temperature control loop and the wavelength monitor loop.

The temperature control loop side comprises: a thermal resistor 103 for detecting the temperature of a light emitting device 102 and outputting a signal according to a change in a resistance value; a resistance value—voltage converting circuit (temperature sensing circuit) 105 for converting the signal to a voltage signal; a first difference signal generating circuit 106; an electronic heating and cooling device driving circuit 108; and an electronic heating and cooling device 104 such as a Peltier device.

On the other hand, the wavelength control loop comprises an optical branching device 110, a wavelength monitor 111, a second reference voltage input terminal 112, a second difference signal generating circuit 113, an adding circuit 114, a sample and hold circuit 115, and a switching circuit (analog switch) 116. Further, the difference signal generating circuit 106 which receives outputs of the switching circuit 116 and the resistance value—voltage converting circuit 105 is disposed between the temperature control loop and the wavelength control loop. Each of the first and second difference signal generating circuits takes the form of a differential amplifier.

In the temperature control loop, the resistance value of the thermal resistor 103 such as a thermistor mounted in the LD module 101 is converted to a voltage by the resistance value—voltage converting circuit 105. The voltage obtained by the conversion and the reference voltage supplied from a reference voltage terminal 107 are supplied to the input terminals of the difference signal generating circuit 106 acting as a negative feedback circuit. An output (difference voltage) of the difference signal generating circuit 106 is supplied to the driving circuit 108 of the electronic heating and cooling device 104. By the driving circuit 108, the electronic heating and cooling device 104 constructed by the Peltier device is driven on the basis of the differential voltage. It is consequently controlled so that the difference between the voltage value of the resistance value—voltage converting circuit (temperature sensing circuit) 105 and the reference voltage is reduced.

On the other hand, in the wavelength control loop, a part of the signal light outputted from the LD device 102 is branched by the optical branching device 110. The wavelength of the signal light branched by the optical branching device 110 is monitored by the wavelength monitor 111 and a voltage corresponding to the wavelength is outputted.

A second reference voltage is set in the second reference voltage terminal 112 on the wavelength control loop side. The voltage signal outputted from the wavelength monitor 111 is compared with the second reference voltage inputted from the second reference voltage input terminal by the difference signal generating circuit 113 and the difference voltage is outputted as an error signal indicative of the wavelength difference.

The first reference voltage from the first reference voltage input terminal 107 and the output voltage of the second difference signal generating circuit 113 are added by the adding circuit 114. In response to a trigger signal, an output voltage of the adding circuit 114 is sampled and held by the sample and hold circuit 115 and a held voltage is outputted.

The first reference voltage from the first reference voltage terminal 107 and an output voltage of the sample and hold circuit 115 are supplied to the change-over switch circuit (analog switch circuit) 116 and one of the voltages is selected and outputted. The output of the change-over switch circuit 116 is supplied to the other input terminal of the first difference signal generating circuit 106.

An output of the first difference signal generating circuit 106 is supplied to the driving circuit 108 of the electronic heating and cooling device 104, and the electronic heating and cooling device 104 such as Peltier device is driven. An output of the switching circuit 116 is supplied as a reference voltage to the first difference signal generating circuit 106. An output voltage from the resistance value—voltage converting circuit 105 is differentially amplified on the basis of the reference voltage and the driving circuit 108 of the electronic heating and cooling device 104 is controlled so as to reduce the difference between the voltage value of the resistance value—voltage converting circuit 105 and the reference voltage.

In the first embodiment of the wavelength control circuit of the invention, in the case of an analog system, each of the first and second difference signal generating circuits 106 and 113 takes the form of, for example, a differential amplifier. In the case of a digital control system, a subtracting and amplifying process can be executed by an arithmetic processing circuit such as a CPU.

In the first embodiment of the wavelength control circuit of the invention, the sample and hold circuit 115 is not limited to a sample and hold circuit of an analog circuit system comprising a switch for sampling a signal and a capacitor for holding the sampled signal but can have a construction comprising an A/D converter for converting an output voltage of the adding circuit 114 into a digital signal and a writable non-volatile memory for storing the signal outputted from the A/D converter. With the construction, a control to a predetermined wavelength can be performed even after the power is turned off after a wavelength deviation in a light source occurs.

The operation of the first embodiment of the wavelength control circuit of the invention will now be described.

As shown in FIG. 3, the value of resistance of the thermal resistor 103 such as a thermistor mounted in the LD module 101 is converted to a voltage by the resistance value—voltage converting circuit 105. The voltage obtained by the conversion is applied to one input terminal of the first differential amplifier 106.

A part of the light signal from the LD device 102 is branched by the optical branching device 110. The wavelength of the signal light branched by the optical branching device 110 is monitored by the wavelength monitor 111 and a voltage corresponding to the wavelength is outputted.

At power-on, the first reference voltage from the first reference voltage terminal 107 is selected by the change-over switch circuit 116 and is applied as a reference voltage to the first difference signal generating circuit 106. Since it is operated so that the first reference voltage is selected by the change-over switch circuit 116 at power-on, the LD device 102 is controlled so as to be in a predetermined temperature range by the temperature control loop comprised of the thermal resistor 103, resistance value—voltage converting circuit 105, difference signal generating circuit 106, electronic heating and cooling device drive circuit 108, and electronic heating and cooling device 104.

That is, the resistance value of the thermal resistor 103 such as a thermistor mounted in the LD module 101 is converted into a voltage by the resistance value—voltage converting circuit 105. Both of the voltage of the resistance value—voltage converting circuit 105 and the first reference voltage from the first reference voltage terminal 107 are applied to the difference signal generating circuit 106 and an output of the circuit 106 is supplied to the electronic heating and cooling device driving circuit 108. The electronic heating and cooling device 104 is controlled so as to reduce the difference between the voltage of the resistance value—voltage converting circuit 105 and the first reference voltage. The first reference voltage is adjusted so that the wavelength of the signal from the LD device 102 reaches at a predetermined wavelength at a circuit adjusting stage.

After that, when the temperature control operation is stabilized, the change-over switch circuit 116 is switched so that an output from the sample and hold circuit 115 is applied as a reference voltage to the first difference signal generating circuit 106. Since the wavelength of the signal light is consequently controlled to be a predetermined wavelength, the second difference signal generating circuit 113 to which an output voltage of the wavelength monitor 111 and the second reference voltage are applied outputs the voltage corresponding to no error, for example, 0V.

Further, the first reference voltage and the output voltage of the second difference signal generating circuit 113 are inputted to the adding circuit 114. A voltage signal obtained by adding an error signal voltage from the second difference signal generating circuit 113 to the first reference voltage by the adding circuit 114 is outputted.

The voltage signal outputted from the adding circuit 114 is inputted to the sample and hold circuit 115. In response to a trigger signal, the sample and hold circuit 115 samples the inputted signal, holds the voltage, outputs the held voltage. The trigger signal may an internal self trigger or a trigger from the outside.

The first reference voltage and the output voltage of the sample and hold circuit 115 are supplied to the switching circuit 116. At power-on, the first reference voltage is selectively outputted. After elapse of time in which the temperature control circuit is sufficiently stabilized, an output voltage of the sample and hold circuit 115 is selectively outputted.

When the wavelength of the signal light of the LD device 102 is changed for a some reason, for example, aging deterioration of the LD device 102, the output voltage of the wavelength monitor 111 changes. The output voltage of the second difference signal generating circuit 113 and the output voltage of the adding circuit 114 sequentially change, and an output voltage of the sample and hold circuit 115 changes in response to the trigger signal as a trigger.

Since the change-over switching circuit 116 selectively outputs an output of the sample and hold circuit 115, an output voltage of the change-over switching circuit 116 serves as a reference voltage of the first differential amplifying circuit 106 to drive the electronic heating and cooling device 104. As a result, the wavelength of the signal light of the LD device is controlled to a predetermined wavelength.

Since the reference voltage applied to the first difference signal generating circuit 106 is held by interrupting the trigger signal of the sample and hold circuit 115, the wavelength monitor 111 itself can be maintained in short time without a problem.

Figure 4:
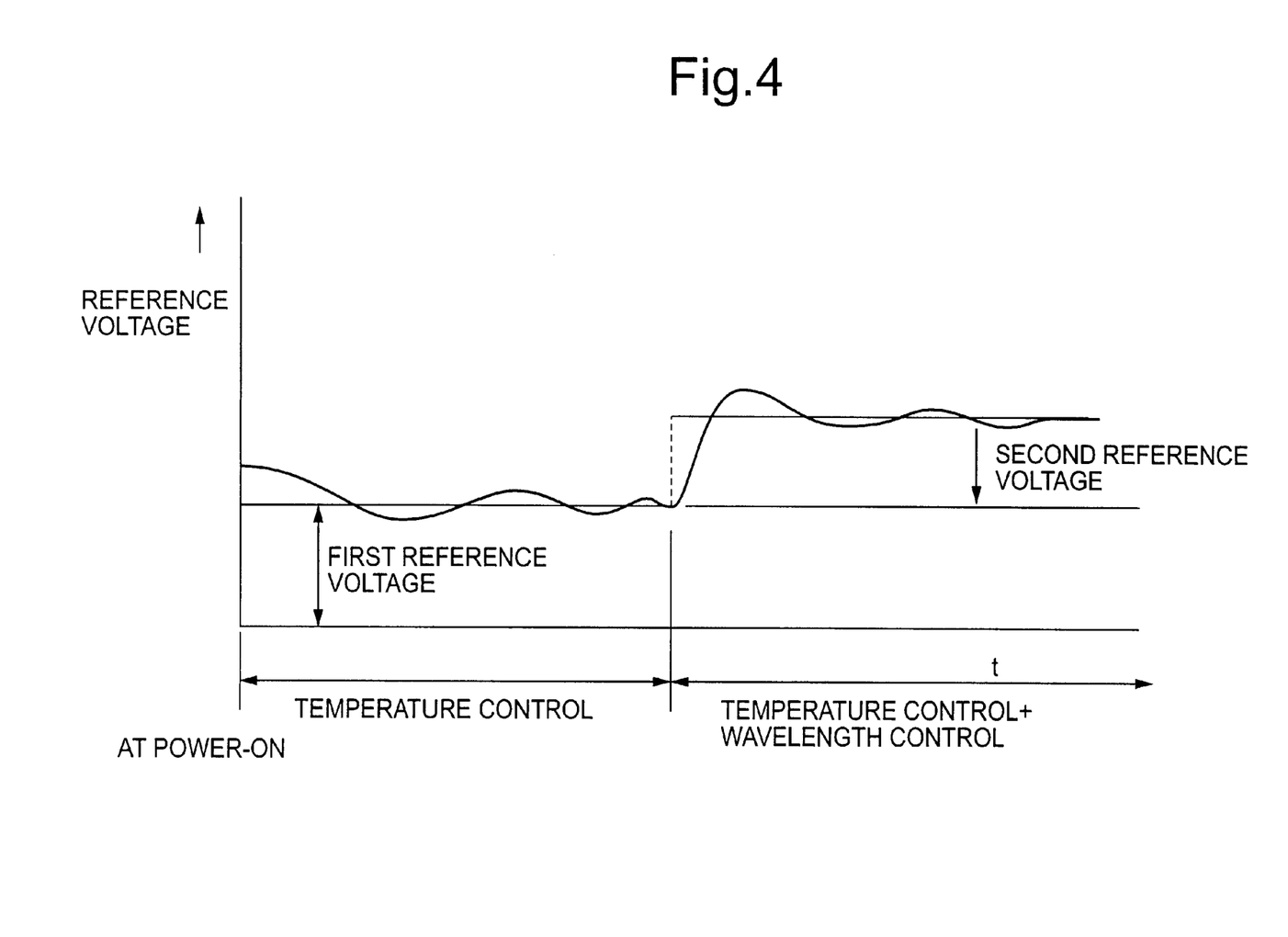
FIG. 4 is a diagram schematically showing a state of the temperature and the wavelength control in the first embodiment of the wavelength control circuit of the invention.

FIG. 4 is a diagram schematically showing the relations among the time, reference voltage, temperature, and output voltage in the wavelength control loop for making the state of the temperature and the wavelength control in the wavelength control circuit of the invention understood better. The temperature control is executed by the first reference voltage at power on. After stabilization, the second reference voltage is added and a new reference voltage is set. Then both of the temperature and wavelength are controlled. The switching by the switching circuit 116 may be performed after the temperature control based on the first reference value is stabilized. Whether the stable state is obtained or not may be determined by, for example, a deviation in the first difference signal. Alternately, it is possible to preset predetermined time as standard time, and after elapse of the standard time, uniformly perform the switching.

In the embodiment, an LD as a light emitting device can take the form of not only a semiconductor LD (semiconductor laser) but also a modulator integrated type LD. In the embodiment, a part of the signal light emitted from the front side of the LD device is branched by the optical branching device 110 and the wavelength is monitored. It is also possible to receive the signal light emitted from the rear side of the LD device and monitor the wavelength (not shown).

In the embodiment, the negative feedback loop for the temperature control and the wavelength control is not limited to the analog system. Similar effects can be also obtained by a digital control circuit using CPU, DSP (Digital Signal Processor), and the like.

By using an A/D converter and a non-volatile memory (electrically erasable programmable ROM, EEPROM) for storing output data of the A/D converter, the sample and hold circuit can control the wavelength to a predetermined wavelength even after the turn-off of the power after occurrence of a wavelength deviation in the LD. In this case, a circuit for detecting the second turn-on of the power after the turn-off of the power is provided. At power on, it is sufficient to control the switch 116 so as to select the output of the sample and hold circuit 115.

In the wavelength control circuit of the invention, the control loop can be also realized by a digital control. In this case, for example, the temperature control loop receives a digital signal obtained by converting the voltage of the resistance value—voltage converting circuit 105 by the A/D converter as a first input. One of the digital signal corresponding to the first reference voltage applied from the first reference voltage terminal 107 and a digital output signal of the sample and hold circuit 115 is obtained as a second input via the switch 116. It is sufficient to convert an output of a subtracting circuit (CPU) for obtaining the difference between the first and second inputs into an analog signal and supply the analog signal to the electronic heating and cooling device drive circuit 108.

In the wavelength control loop, the digital signal obtained by converting the output voltage of the wavelength monitor 111 by the A/D converter and the digital signal corresponding to the second reference voltage applied from the second reference voltage terminal 112 are subjected to subtraction by a subtracting circuit 117 and a resultant is outputted as an error signal. The error signal is added with the digital signal corresponding to the first reference voltage by the adding circuit and the resultant value may be held in an EEPROM or the like in response to a trigger signal.

In the case of performing the digital control or in the case of using the EEPROM or the like, the switching circuit 116 may take the form of a selector circuit (multiplexer having two inputs and one output) using a digital circuit.

Second and third embodiments of the wavelength control circuit of the semiconductor laser diode of the invention will now be described.

Figure 5:
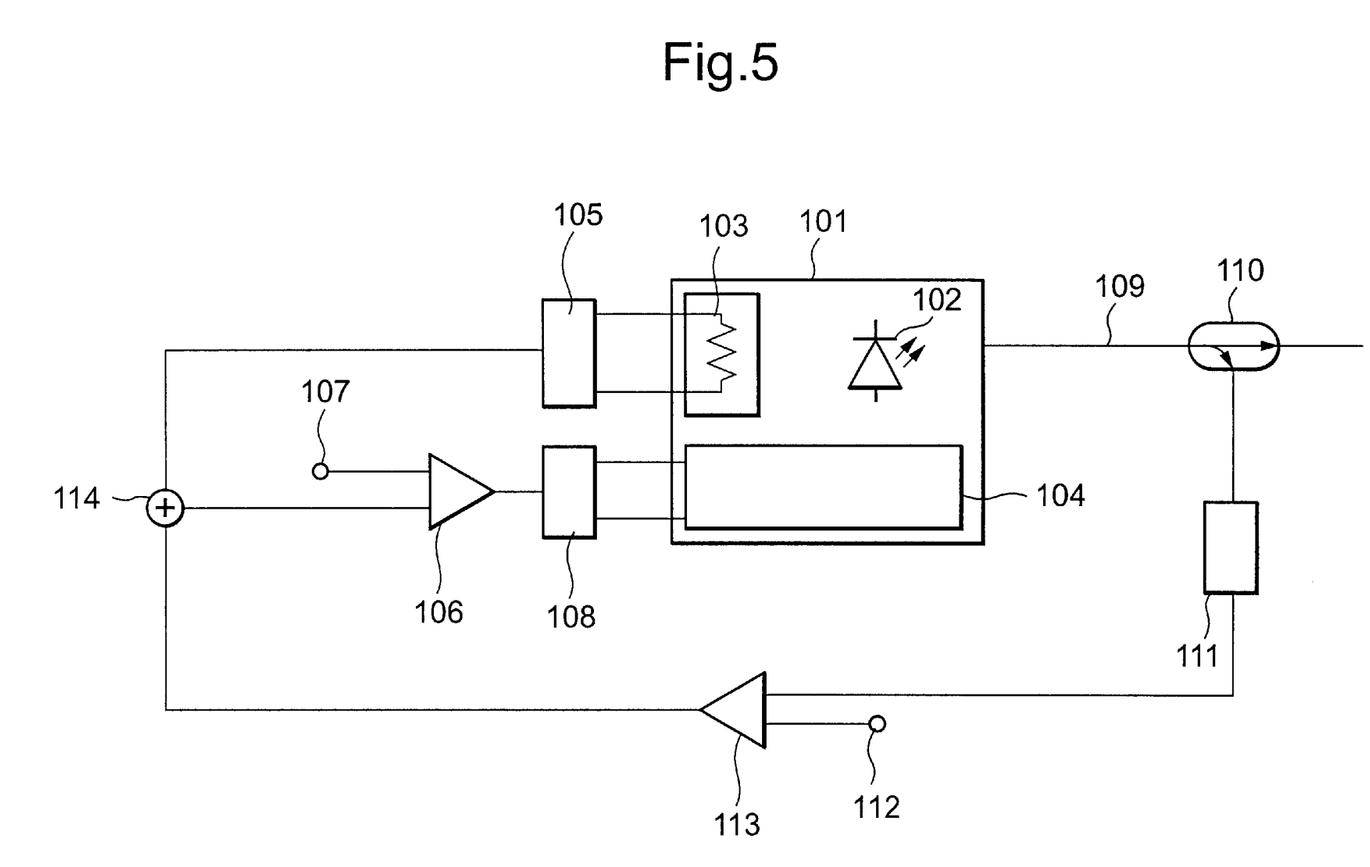
FIG. 5 is a diagram showing the construction of a second embodiment of the wavelength control circuit of the light emitting device of the invention.

FIG. 5 is a diagram showing the construction of the second embodiment of the wavelength control circuit of the invention. In the embodiment, different from the first embodiment shown in FIG. 3, the switching circuit 116 is not provided. The wavelength monitored by the wavelength monitor 111 is compared with the second reference voltage set at the second reference voltage input terminal by the difference signal generating circuit 113 and a difference voltage indicative of a wavelength deviation is outputted. The difference voltage is first added with the output voltage of the resistance value—voltage converting circuit 105 by the adding circuit 114. The voltage obtained by the addition is supplied to the first difference signal generating circuit 106 and compared with the first reference voltage. The electronic heating and cooling device 104 is controlled via the driving circuit 108 by an output of the first difference signal generating circuit 106.

Figure 6:
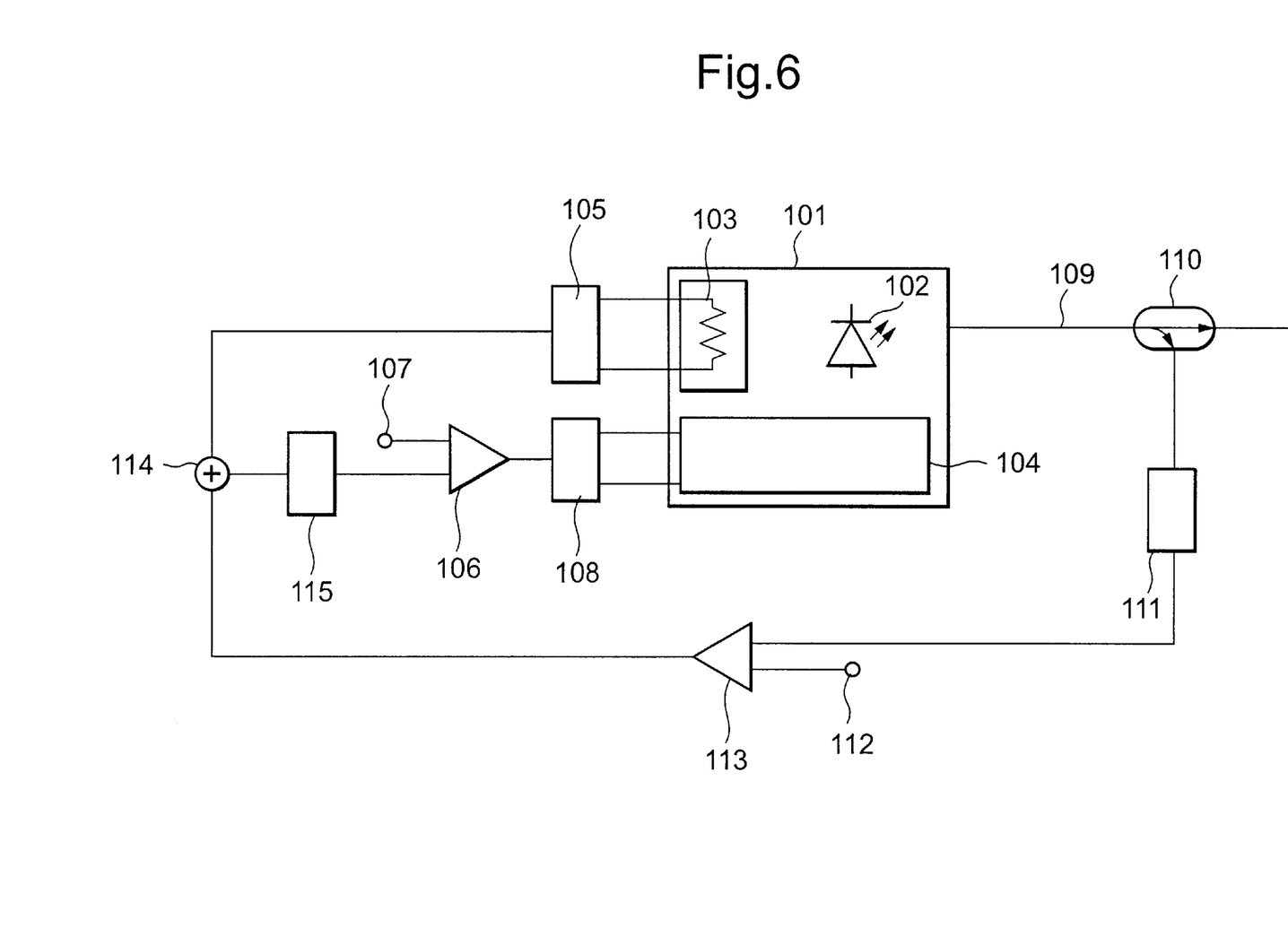
FIG. 6 is a diagram showing the construction of a third embodiment of the wavelength control circuit of the light emitting device of the invention.

FIG. 6 is a diagram showing the construction of the third embodiment of the wavelength control circuit of the invention. The construction of the embodiment is different from that of the second embodiment shown in FIG. 5 with respect to a point such that the sample and hold circuit 115 is disposed between the adding circuit 114 and the first difference signal generating circuit 106. In the embodiment, the temperature control is executed by the reference voltage held by the sample and hold circuit 115 for sampling and holding a new reference voltage. By enabling the reference voltage to be held, the wavelength monitor can be maintained.

Obviously, in a manner similar to the first embodiment, the second and third embodiments of the invention can be variously modified. The LD as a light emitting device can take the form of not only a semiconductor LD (semiconductor laser) but also a modulator integrated type LD. Although apart of the signal light emitted from the front side of the LD device is branched by the optical branching device 110 and the wavelength is monitored, it is also possible to receive the signal light emitted from the rear side of the LD device and monitor the wavelength. The negative feedback loop for temperature control and wavelength control is not limited to the analog system in the foregoing embodiments. Similar effects can be obtained by a digital control circuit using the CPU, DSP (Digital Signal Processor), and the like. In the wavelength control circuit of the invention, the control loop can be also performed by a digital control.

As described above, according to the laser wavelength control apparatus of the invention, not only the case where the wavelength of the LD device changes with time but also at the time of maintenance of the wavelength monitor itself, the wavelength control can be accurately performed.

While this invention has been described in connection with certain preferred embodiments, it is to be understood that the subject matter encompassed by way of this invention is not to be limited to those specific embodiments. On the contrary, it is intended for the subject matter of the invention to include all alternative, modification and equivalents as can be included within the spirit and scope of the following claims.

What is claimed is:

1. A wavelength control circuit of a light emitting device, comprising:

a light emitting device for emitting signal light;

a temperature sensing circuit for sensing a temperature around the light emitting device and outputting a temperature signal according to the temperature;

a wavelength deviation detecting circuit for detecting an oscillation wavelength of the signal light and outputting a second difference signal according to a wavelength deviation from a predetermined wavelength;

an adding circuit for adding a first reference value with the second difference signal and outputting a signal obtained by the addition;

a switching circuit for selectively outputting either the first reference value or the signal obtained by the addition;

a first difference signal generating circuit for comparing the first reference value or the signal obtained by the addition outputted from the switching circuit with the temperature signal and outputting a first difference signal; and a temperature control circuit for controlling the temperature of the light emitting device by controlling a heating and cooling device on the basis of the first difference signal.

2. A wavelength control circuit of a light emitting device according to claim 1, wherein the switching circuit selects the first reference value after the start of light emission of the light emitting device and, after that, switches to select and output the signal obtained by the addition.

3. A wavelength control circuit of a light emitting device according to claim 2, wherein the switching circuit selects the first reference value after the start of light emission of the light emitting device and, when a deviation of the first difference signal becomes smaller than a predetermined value, the switching circuit switches to select and output the signal obtained by the addition.

4. A wavelength control circuit of a light emitting device according to claim 2, wherein the switching circuit selects the first reference value for a predetermined time after the start of light emission of the light emitting device and switches to select and output the signal obtained by the addition after elapse of the predetermined time.

5. A wavelength control circuit of a light emitting device according to claim 2, further comprising a sample and hold circuit for sampling and holding the signal obtained by the addition as a sampled signal and outputting the sampled signal, and wherein the switching circuit selectively outputs the first reference value or the sampled signal.

6. A wavelength control circuit of a light emitting device according to claim 5, wherein the sample and hold circuit comprises:

an A/D converting circuit for converting the signal obtained by the addition into a digital signal; and a writable non-volatile memory for storing and holding the digital signal outputted from the A/D converting circuit.

7. A wavelength control circuit of a light emitting device according to claim 2, wherein the wavelength deviation detecting circuit includes:

a wavelength monitor for outputting a wavelength signal according to the wavelength of the signal light; and a second difference signal generating circuit for comparing the wavelength signal with a second reference voltage and outputting the second difference signal.

8. A wavelength control circuit of a light emitting device according to claim 7, wherein the wavelength deviation detecting circuit further comprises an optical branching device for branching a part of signal light emitted from the light emitting device and outputting the branched signal light to the wavelength monitor.

9. A wavelength control circuit of a light emitting device according to claim 7, wherein the wavelength deviation detecting circuit outputs signal light emitted from the rear side of the light emitting device to the wavelength monitor.

10. A wavelength control circuit of a light emitting device, comprising:

a light emitting device for emitting signal light;

a temperature sensing circuit for sensing a temperature around the light emitting device and outputting a temperature signal according to the temperature;

a wavelength deviation detecting circuit for detecting an oscillation wavelength of the signal light and outputting a second difference signal according to a wavelength deviation from a predetermined wavelength;

an adding circuit for adding the second difference signal with the temperature signal and outputting a signal obtained by the addition;

a first difference signal generating circuit for comparing a first reference value with the signal obtained by the addition and outputting a first difference signal; and a temperature control circuit for controlling the temperature of the light emitting device by controlling a heating and cooling device on the basis of the first difference signal.

11. A wavelength control circuit of a light emitting device according to claim 10, further comprising a sample and hold circuit for sampling and holding the signal obtained by the addition and outputting a sampled signal, wherein the switching circuit selectively outputs the first reference value or the sampled signal.

12. A wavelength control circuit of a light emitting device according to claim 11, wherein the sample and hold circuit comprises:

an A/D converting circuit for converting the signal obtained by the addition into a digital signal; and a writable non-volatile memory for storing and holding the digital signal outputted from the A/D converting circuit.

13. A wavelength control circuit of a light emitting device according to claim 10, wherein the wavelength deviation detecting circuit comprises:

a wavelength monitor for outputting a wavelength signal according to the wavelength of the signal light; and a second difference signal generating circuit for comparing the wavelength signal with a second reference voltage and outputting the second difference signal.

14. A wavelength control circuit of a light emitting device according to claim 13, wherein the wavelength deviation detecting circuit further comprises an optical branching device for branching a part of signal light outputted from the light emitting device and outputting the branched signal light to the wavelength monitor.

15. A wavelength control circuit of a light emitting device according to claim 13, wherein the wavelength deviation detecting circuit outputs signal light emitted from the rear side of the light emitting device to the wavelength monitor.

16. A wavelength control circuit of a light emitting device, comprising:

a temperature sensing circuit for sensing a temperature around a light emitting device and outputting the temperature as a voltage;

a first difference signal generating circuit for receiving a voltage signal outputted from the temperature sensing circuit and a reference voltage signal and outputting a difference signal between the signals;

a heating and cooling device driving circuit for receiving an output of the first difference signal generating circuit;

a heating and cooling device driven by the heating and cooling device driving circuit;

an optical branching device for branching a part of a light signal from the light emitting device;

a wavelength monitor for monitoring the wavelength of the signal branched by the optical branching circuit and outputting a voltage signal corresponding to the wavelength;

a second difference signal generating circuit for receiving the voltage signal from the wavelength monitor and a second reference voltage signal and outputting a difference signal between the signals;

an adding circuit for adding a first reference voltage signal and the output signal of the second difference signal generating circuit;

a sample and hold circuit for sampling an output signal of the adding circuit and holding and outputting the sampled signal; and a switching circuit for receiving the first reference voltage signal and an output of the sample and hold circuit as inputs and selectively outputting one of the inputs as the reference voltage to the first difference signal generating circuit.

17. A wavelength control circuit of a light emitting device according to claim 16, wherein the switching circuit selects the first reference voltage and supplies the first reference voltage as the reference voltage to the first difference signal generating circuit at the time of start of light emission of the light emitting device, after that, switches to the output side of the sample and hold circuit, and supplies it as the reference voltage to the first difference signal generating circuit.

18. A wavelength control circuit of a light emitting device according to claim 17, wherein the sample and hold circuit samples an output of the adding circuit at the time point when a trigger signal is inputted and holds the sampled value also after light emission of the light emitting device is stopped.

19. A wavelength control method of a light emitting device comprising:

a light emitting device for emitting signal light;

a temperature sensing circuit for sensing a temperature around the light emitting device and outputting a temperature signal according to the temperature;

a wavelength deviation detecting circuit for detecting an oscillation wavelength of the signal light and outputting a second difference signal according to a wavelength deviation from a predetermined wavelength;

an adding circuit for adding a first reference value with the second difference signal and outputting a signal obtained by the addition;

a switching circuit for selectively outputting either the first reference value or the value obtained by the addition;

a first difference signal generating circuit for comparing the first reference value or the signal obtained by the addition outputted from the switching circuit with the temperature signal and outputting a first difference signal; and a temperature control circuit for controlling the temperature of the light emitting device by controlling a heating and cooling device on the basis of the first difference signal, wherein the switching circuit selects the first reference value at the time of start of the light emission of the light emitting device and, after that, switches so as to selectively output the signal obtained by the addition.

20. A wavelength control method of a wavelength control circuit of a light emitting device according to claim 19, further comprising a sample and hold circuits sampling and holding the signal obtained by the addition and outputting the sampled signal, wherein the sample and hold circuit holds the output of the adding circuit at the time point when a trigger signal is inputted and holds the signal even when the power is turned off.

* * * * *